(12) United States Patent
Tomishima

(10) Patent No.: US 6,288,601 B1
(45) Date of Patent: *Sep. 11, 2001

(54) BOOSTED POTENTIAL GENERATING CIRCUIT

(75) Inventor: Shigeki Tomishima, Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 672 days.

(21) Appl. No.: 08/496,121

(22) Filed: Jun. 27, 1995

(30) Foreign Application Priority Data

Oct. 5, 1994 (JP) .................................................. 6-241308

(51) Int. Cl.$^7$ ....................................................... G05F 3/02
(52) U.S. Cl. ........................................... 327/536; 327/537
(58) Field of Search ..................................... 327/390, 535, 327/536, 537, 538, 540, 541, 543, 589

(56) References Cited

U.S. PATENT DOCUMENTS

| | | | |
|---|---|---|---|
| 4,581,546 | * 4/1986 | Allan | 327/537 |
| 4,733,108 | * 3/1988 | Truong | 327/537 |
| 4,935,644 | * 6/1990 | Tsujimoto | 327/537 |
| 4,979,088 | * 12/1990 | Misaki et al. | 307/110 |
| 5,023,465 | * 6/1991 | Douglas et al. | 327/534 |
| 5,081,371 | * 1/1992 | Wong | 327/537 |
| 5,140,182 | * 8/1992 | Ichimura | 327/537 |
| 5,202,588 | * 4/1993 | Matsuo et al. | 327/537 |
| 5,367,489 | 11/1994 | Park et al. | 327/536 |

FOREIGN PATENT DOCUMENTS 4-84455  3/1992  (JP) .

OTHER PUBLICATIONS

IBM Technical Disclosure Bulletin—"Voltage Regulator Circuit For CMOS Substrate Voltage Generator", vol. 28 No. 3, Aug. 1985, pp. 1287–1288.*

1992 Symposium on VLSI Circuits Digest of Technical Papers, Application of a High–Voltage Pumped Supply for Low–Paper DRAM, by R.C. Foss, et al., pp. 106–107.

IEEE Journal of Solid–State Circuits, An Experimental 1.5–V 64–Mb DRAM, by Yoshinobu Nakagome et al., vol. 26, No. 4, Apr. 1991, pp. 465–472.

* cited by examiner

Primary Examiner—Terry D. Cunningham
(74) Attorney, Agent, or Firm—McDermott, Will & Emery

(57) ABSTRACT

A boosted potential generating circuit supplies a boosted potential of a sufficient potential which is provided to the word lines in a dynamic random access memory (DRAM). The boosted potential generating circuit includes a first node which is precharged to a power supply potential Vcc by a first precharge potential generator, and a second node which is precharged to Vcc by a second precharge potential generator and raised to a potential of 2Vcc by a first capacitive element. Further, the potential of a boosted potential node is also precharged to Vcc. When the potential of a clock signal is Vcc, the output of a first buffer means rises to Vcc. Hence, the potential of a second capacitive element rises, and the potential of the first node is raised from Vcc to 2Vcc. On the other hand, the output potential of the second buffer means falls to a ground potential, and the potential of the second node drops to Vcc by the first capacitive element, so that a P-channel type MOS transistor becomes conductive. The charges at the second capacitive element flow into the boosted potential node through the P-channel type MOS transistor and are stored in a load capacitor. The potential of the boosted potential node rises from Vcc to 2Vcc at every rise of the clock signal to Vcc.

33 Claims, 7 Drawing Sheets

101 : CLOCK INPUT NODE
102 : BOOSTED POTENTIAL NODE
104 : P-CHANNEL TYPE MOS TRANSISTOR
105 : FIRST NODE
106 : SECOND NODE
107 : FIRST BUFFER MEANS
108 : FIRST CAPACITIVE ELEMENT
109 : SECOND BUFFER MEANS
110 : SECOND CAPACITIVE ELEMENT
111 : FIRST PRECHARGE POTENTIAL GENERATOR
112 : SECOND PRECHARGE POTENTIAL GENERATOR

- 101 : CLOCK INPUT NODE
- 102 : BOOSTED POTENTIAL NODE
- 104 : P-CHANNEL TYPE MOS TRANSISTOR
- 105 : FIRST NODE
- 106 : SECOND NODE
- 107 : FIRST BUFFER MEANS
- 108 : FIRST CAPACITIVE ELEMENT
- 109 : SECOND BUFFER MEANS
- 110 : SECOND CAPACITIVE ELEMENT
- 111 : FIRST PRECHARGE POTENTIAL GENERATOR
- 112 : SECOND PRECHARGE POTENTIAL GENERATOR

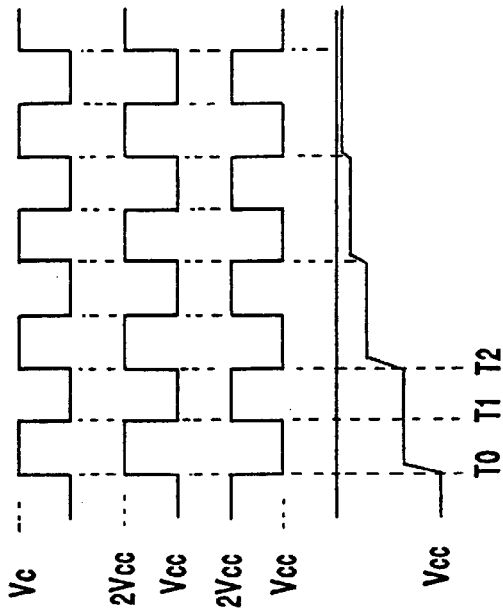
FIGURE 3(a) CLOCK (CLK) SIGNAL
FIGURE 3(b) FIRST NODE 105 POTENTIAL
FIGURE 3(c) SECOND NODE 106 POTENTIAL
FIGURE 3(d) BOOSTED POTENTIAL NODE 102 POTENTIAL
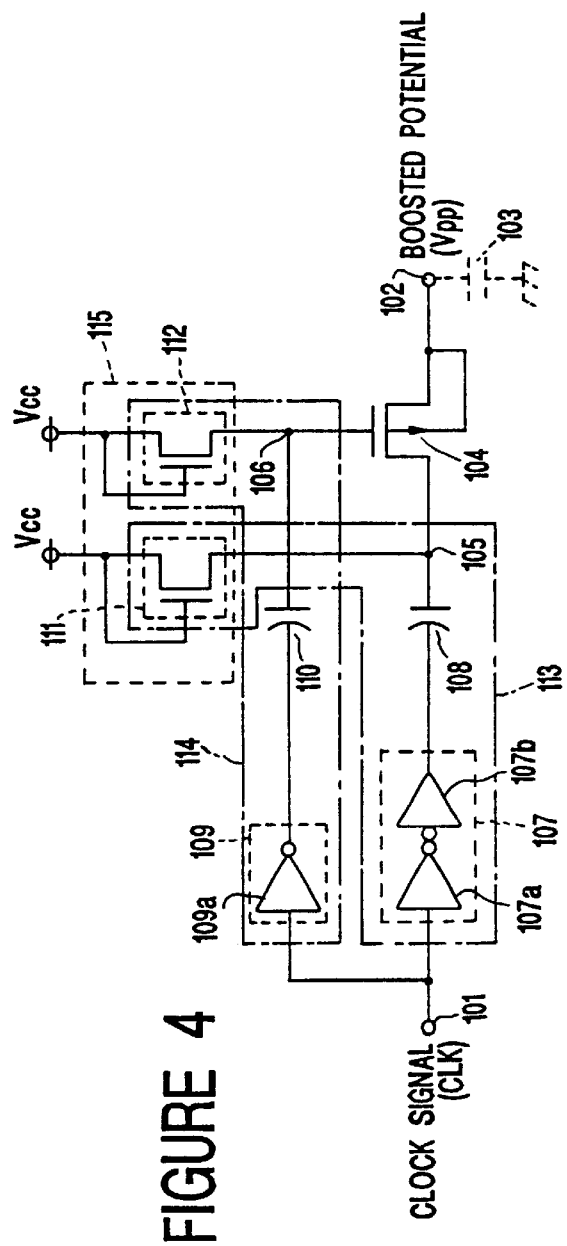
FIGURE 4

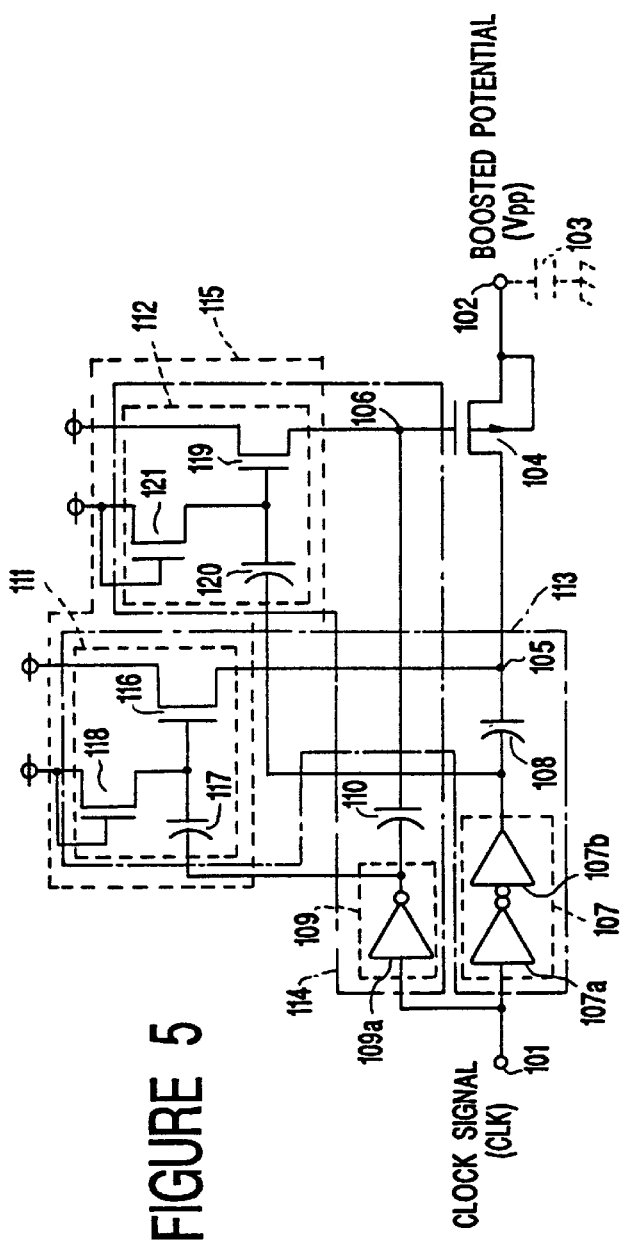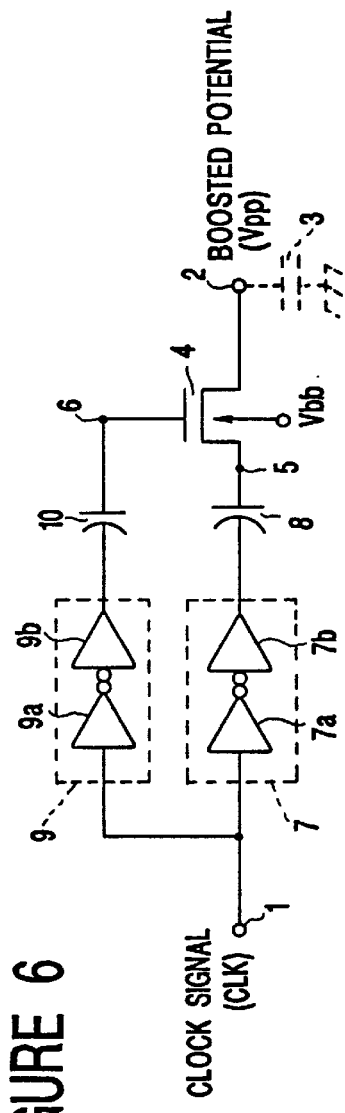
FIGURE 5
FIGURE 6

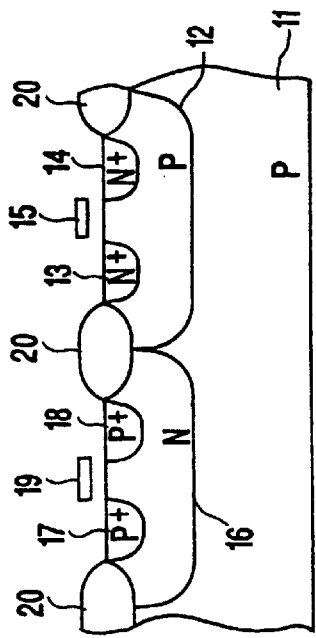
FIGURE 7
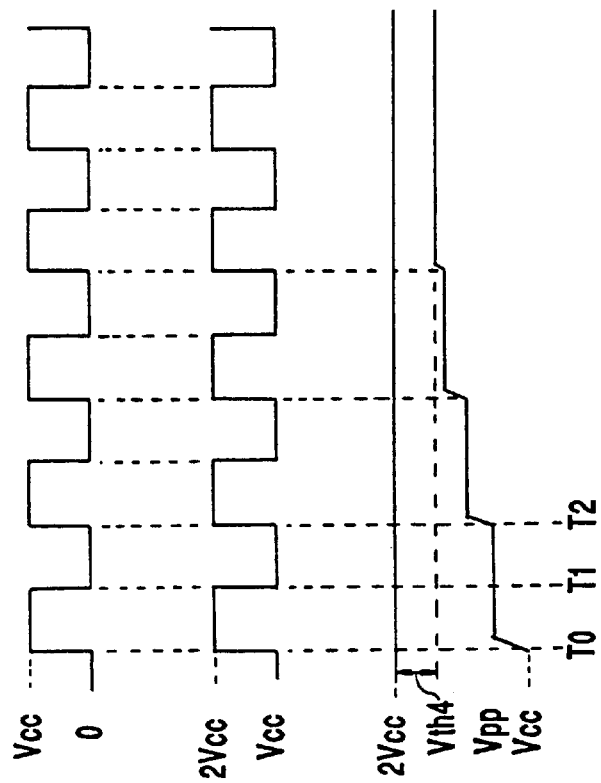
FIGURE 8(a) CLOCK (CLK) SIGNAL
FIGURE 8(b) FIRST NODE 5 POTENTIAL
SECOND NODE 6 POTENTIAL
FIGURE 8(c) BOOSTED POTENTIAL
NODE 2 POTENTIAL

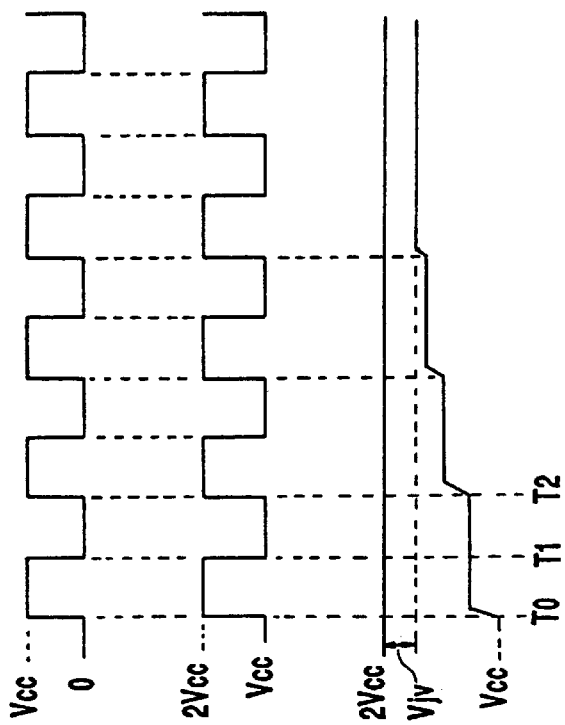
FIGURE 12(a) CLOCK (CLK) SIGNAL
FIGURE 12(b) FIRST NODE 5 POTENTIAL
SECOND NODE 6 POTENTIAL
FIGURE 12(c) BOOSTED POTENTIAL
NODE 2 POTENTIAL Vpp
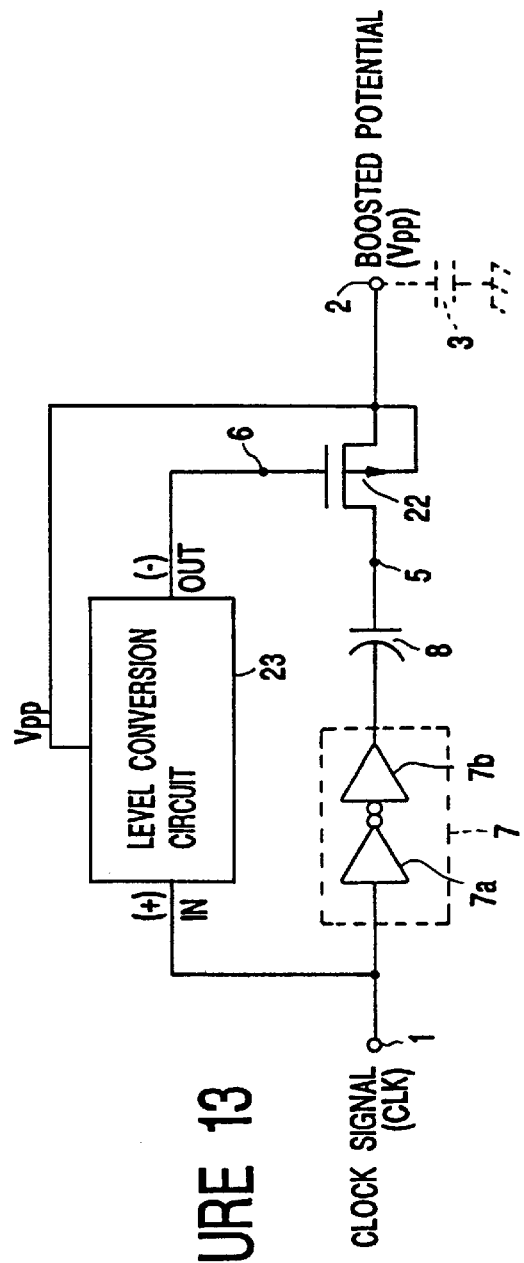
FIGURE 13

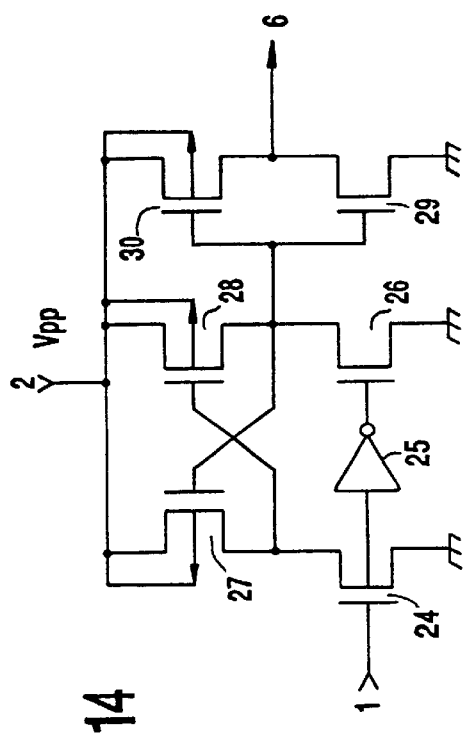
FIGURE 14
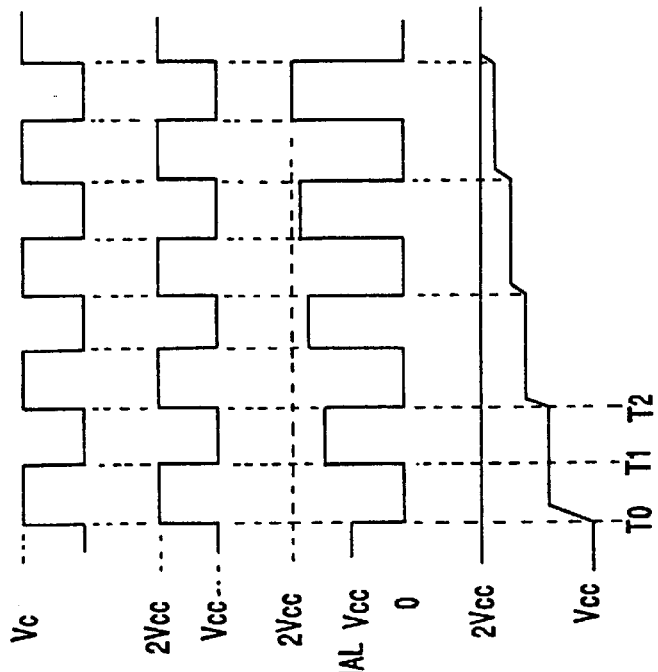
FIGURE 15(a) CLOCK (CLK) SIGNAL
FIGURE 15(b) FIRST NODE 5 POTENTIAL
FIGURE 15(c) SECOND NODE 6 POTENTIAL
FIGURE 15(d) BOOSTED POTENTIAL NODE 2 POTENTIAL Vpp

US 6,288,601 B1

BOOSTED POTENTIAL GENERATING CIRCUIT

TECHNICAL FIELD

The present invention relates to a boosted potential generating circuit. The present invention has particular application to a semiconductor memory device, such as a dynamic random access memory (DRAM), for feeding the word lines with a boosted potential with respect to a power supply potential.

BACKGROUND ART

FIGS. 6–9 show a conventional boosted potential generating circuit. In FIG. 6, the boosted potential generating circuit has a clock input node 1 for receiving a clock (CLK) signal of binary levels consisting of a ground potential (0V) and a power supply potential (Vcc), as shown in FIG. 8(a), and a boosted potential node 2 for supplying a boosted potential. A load capacitor 3 is driven by the boosted potential supplied to the boosted potential node 2, and the load capacitor 3 is a parasitic capacitance existing between the boosted potential node and the ground potential node. An N-channel type MOS transistor 4 serves as a drive transistor for the boosted potential generating circuit, and is connected between the boosted potential node 2 and a first node 5. A gate electrode is connected to a second node 6, and a back gate (a p-well region 12 in FIG. 7) is connected to an output node of potential generating means (not shown) for outputting a negative potential Vbb.

A first buffer means 7 receives the clock signal from the clock input node 1 and outputs a first signal in phase with the clock signal. The first buffer means 7 comprises an even number of stages, or in this example, inverters 7a and 7b of two stages. A first capacitive element 8 has a pair of electrodes, where one electrode receives the first signal from the first buffer means 7 and the other electrode is connected to the first node 5. A second buffer means 9 receives the clock signal from the clock input node 1 and outputs a second signal in phase with the clock signal. The second buffer means 9 comprises an even number of stages, or in this example, inverts 9a and 9b of two stages. A second capacitor 10 has a pair of electrodes, where one electrode receives the second signal from the second buffer means 9 and the other electrode is connected to the second node 6.

FIG. 7 illustrates the boosted potential generating circuit incorporated in a semiconductor memory device, such as a dynamic random access memory (DRAM), with the N-channel type MOS transistor 4 having a pair of source and drain regions 13 and 14 formed in a p-well region 12 formed on a major surface of a semiconductor substrate 11, and a gate electrode 15. Since the semiconductor substrate 11 is supplied with the negative potential Vbb, the negative potential Vbb is also supplied back gate of the N-channel type MOS transistor 4. In FIG. 7, a P-channel type MOS transistor is also fabricated with the N-channel type MOS transistor 4. The P-channel type MOS transistor comprises a pair of source and drain regions 17 and 18 formed in an n-well region 16 formed on the major surface of a semiconductor substrate 11, and a gate electrode 19. Such a structure is generally referred to as a twin well structure. An oxide film 20 surrounds an element forming region to electrically isolate the elements.

The first and second nodes 5 and 6 in FIG. 6 are precharged to the power supply potential Vcc (or a potential lower than the power supply potential by a threshold voltage of a MOS transistor) prior to application of the boosted potential to the boosted potential node 2 by a precharge means (not shown). Before the boosted potential is supplied to the boosted potential node 2 (or before time T0 shown in FIG. 8), the first and second nodes 5 and 6 are precharged to the power supply potential Vcc by the precharge means. As a result, the potential of the boosted potential node 2 is set at Vcc−Vth4 by conduction of the N-channel type MOS transistor 4, where Vth4 is a threshold voltage of the N-channel type MOS transistor. Referring to a waveform diagram shown in FIG. 8, the operation of the boosted potential generating circuit is as follows.

At time T0, i.e., when the clock signal shown in FIG. 8(a) is fed to the clock input node 1, inputs potentials of the first and second buffer means 7 and 9 rise to the power supply potential, and output potentials of the first and second buffer means 7 and 9 rise from the ground potential (0V) to the power supply potential Vcc, thereby raising the potentials of the first and second capacitive elements 8 and 10. The electrodes on one side of the first and second capacitive elements 8 and 10 are boosted from the ground potential (0V) to the power supply potential Vcc, so that the potentials of the first and second nodes 5 and 6 are raised from Vcc, which is the precharge potential, to two times Vcc by capacitive coupling of the first and second capacitive elements 8 and 10.

The N-channel type MOS transistor 4 then conducts since its drain potential becomes 2Vcc; its gate potential becomes 2Vcc; and its source potential becomes Vcc−Vth4. Further, the charges at the first capacitive element 8 flow into the boosted potential node 2 through the N-channel type MOS transistor 4 and are stored thereat, so that the potential of the boosted potential node 2 is boosted to Vcc−Vth4+α. The boosted portion α of the potential at the boosted potential node 2 is determined from the capacitance shared between the capacitances of the first capacitive element 8 and the load capacitor 3.

Then, at time T1, i.e., when the clock signal falls to the ground potential, the potentials of the first and second buffer means 7 and 9 also fall to the ground potential, so that the potentials of the first and second nodes 5 and 6 fall to Vcc by the capacitive coupling of the first and second capacitive elements 8 and 10. The N-channel type MOS transistor 4 becomes nonconductive, because its drain potential equals Vcc; its gate potential equals Vcc; and its source potential equals Vcc−Vth4+α. Hence, there is no charge flow from the boosted potential node 2 to the first node 5.

Next, when the clock signal is raised again to the power supply potential Vcc at time T2, the outputs of the first and second buffer means 7 and 9 rise from the ground potential to the power supply potential Vcc, thereby (similar to above) raising the potentials of the first and second capacitive elements 8 and 10, and boosting the potentials of the first and second nodes 5 and 6 to two times Vcc. Further, the N-channel type MOS transistor 4 becomes conductive, and the charges at the first capacitive element 8 flow into the boosted potential node 2 through the N-channel type MOS transistor 4, thereby further raising the potential of the boosted potential node 2. The potential of the boosted potential node 2 is thus boosted stepwise at every rise of the clock signal from the ground potential to the power supply potential, and the boosted potential of 2Vcc−Vth4 is finally obtained at the boosted potential node 2.

As shown in FIG. 9, since the N-channel type MOS transistor 4, in which the negative potential Vbb is fed to the back gate, is used as the drive transistor, the substrate potential (potential of the p-well region 12, i.e., the effective substrate potential) viewed from the source electrode (or the electrode connected to the boosted potential node 2 in this situation) is very deep, and the threshold voltage Vth4 is large. Hence, the boosted potential Vpp obtained at the boosted potential node 2 cannot obtain a high potential.

Another type of a boosted potential generating circuit is shown in FIGS. 10–12, which is not affected from the threshold voltage Vth4, and hence is capable of rendering a higher boosted potential Vpp at the boosted potential node 2. The boosted potential generating circuit of FIG. 10 includes an N-channel type MOS transistor 4 with a structure capable of being independently fed with a potential at the back gate (p-well region) which is electrically connected to the drain electrode.

When the boosted potential generating circuit is incorporated in a semiconductor memory device, for example, such as a DRAM, as shown in FIG. 11, the N-channel type MOS transistor comprises a p-well region 12 formed in an n-well region 21 which is formed on a major surface of a semiconductor substrate 11, a pair of source and drain regions 13 and 14 formed in the p-well region 12, and a gate electrode 15. The p-well region 12 can be electrically isolated from the semiconductor substrate 11, since the p-well region 12 is surrounded by the n-well region 21, and can be fed independently with a potential. Accordingly, the circuit shown in FIG. 10 is realized by electrically connecting the p-well region 12, i.e., the back gate, with the drain electrode. Such a structure is generally referred as a triple well structure. The P-channel type MOS transistor is the same as the transistor shown in FIG. 7.

Referring to a waveform diagram shown in FIG. 12, the operation of the boosted potential generating circuit illustrated in FIG. 10 is as follows. Before the boosted potential is fed to the boosted potential node 2 (or before time T0 shown in FIG. 12), the first and second nodes 5 and 6 are precharged to the power supply potential Vcc by the precharge means (not shown). As a result, the potential of the boosted potential node 2 is set at Vcc–Vth4 by conduction of the N-channel type MOS transistor 4.

When the clock signal of FIG. 12(a) is fed to the clock input node 1 at time T0, the input potentials of the first and second buffer means 7 and 9 rise to the power supply potential. The output potentials of the first and second buffer means 7 and 9 rise from the ground potential (0V) to the power supply potential Vcc. The potentials of the first and second capacitive elements 8 and 10 are raised, and the potentials of the first and second nodes 5 and 6 rise from Vcc, the precharge potential, to two times Vcc by capacitive coupling of the first and second capacitive elements 8 and 10. The N-channel type MOS transistor 4 conducts, and the charges at the first capacitive element 8 flow to the boosted potential node 2 through the N-channel type MOS transistor 4, thereby boosting the potential of the boosted potential node 2 to Vcc–Vth4 +α.

When the clock signal drops to the ground potential at time T1, the potentials of the first and second buffer means 7 and 9 drop to the ground potential, and the potentials of the first and second nodes 5 and 6 decrease to Vcc by the capacitive coupling of the first and second capacitive elements 8 and 10. At time T1, the N-channel type MOS transistor 4 becomes non-conductive, and no charges flow from the boosted potential node 2 to the first node 5.

When the clock signal is raised again to the power supply potential Vcc at time T2, the outputs of the first and second buffer means 7 and 9 are also raised from the ground potential to the power supply potential Vcc. Similarly to the above, the potentials of the first and second capacitive elements 8 and 10 are increased, and the potentials of the first and second nodes 5 and 6 are boosted up to two times Vcc. Accordingly, the N-channel type MOS transistor 4 becomes conductive, and the charges at the first capacitive element 8 flow into the boosted potential node 2 through the N-channel type MOS transistor 4, thereby further raising the potential of the boosted potential node 2.

Accordingly, the potential of the boosted potential node 2 is boosted stepwise at every rise of the clock signal from the ground potential to the power supply potential Vcc. Since the p-well region 12 and the drain of the N-channel type MOS transistor 4 are electrically connected with each other, and the potential is transmitted via the PN junction from the p-well region 12 to the source region (consisting of an n-type diffusion region), a boosted potential Vpp equal to 2Vcc–Vjv is eventually obtained at the boosted potential node 2. The voltage Vjv is a PN junction voltage between the p-well region 12 and the n+ diffusion region constituting the source, and generally, is about 0.6 volts.

The boosted potential generating circuit of FIG. 10 obtains a higher boosted potential Vpp than the boosted potential generating circuit of FIG. 6 whose boosted potential Vpp equals 2Vcc–Vth4, where Vth4>Vjv. However, there is an increase in the process steps and cost to manufacture the boosted potential generating circuit of FIG. 10, since the N-channel type MOS transistor 4 formed from the triple well structure is used as the drive transistor.

Alternatively, a p-channel type MOS transistor can be used as a drive transistor, as illustrated in FIGS. 13–15. In FIG. 13, a P-channel type MOS transistor 22, serving as a drive transistor for the boosted potential generating circuit, is connected between the boosted potential node 2 and the first node 5. The gate electrode is connected Lo the second node 6. The P-channel type MOS transistor 22 comprises a transistor structure of either the P-channel type MOS transistor in the twin well structure of FIG. 7 or the P-channel type MOS transistor in the triple well structure of FIG. 11, in which the back gate (the n-well 16 region) is electrically connected to the drain electrode.

A level conversion circuit 23 receives a clock signal having a Vcc amplitude from the clock input node 1. Based on the boosted potential Vpp at the boosted potential node 2, the level conversion circuit 23 outputs to the second node 6 a second signal having a Vpp amplitude and a phase opposite to the clock signal. FIG. 14 illustrates in detail the level conversion circuit 23.

An N-channel type MOS transistor 24 has a gate electrode connected to the clock input node 1 and a source electrode connected to the ground potential. An inverter circuit 25 receiving the clock signal from the clock input node reverses the phase of the clock signal. An N-channel type MOS transistor 26 has a gate electrode which receives the clock signal whose phase is made opposite at the inverter circuit 25, and a source electrode connected to the ground potential node.

A P-channel type MOS transistor 27 includes a source electrode connected to the boosted potential node 2, a drain electrode connected to the drain electrode of the N-channel type MOS transistor 24, a gate electrode connected to the drain electrode of the N-channel type MOS transistor 26, and a back gate connected to the boosted potential node 2. A P-channel type MOS transistor 28 includes a source electrode connected to the boosted potential node 2, a drain electrode connected to the drain electrode of the N-channel type MOS transistor 26, a gate electrode connected to the drain electrode of the N-channel type MOS transistor 24, and a back gate connected to the boosted potential node 2. Further, the P-channel type MOS transistor 28 is cross-coupled with the P-channel type MOS transistor 27.

An N-channel type MOS transistor 29 has a gate electrode connected to a connection point between the drain electrode of the P-channel type MOS transistor 28 and the drain electrode of the N-channel type MOS transistor 26, a drain electrode connected to the second node 6, and a source electrode connected to the ground potential. A P-channel type MOS transistor 30 includes a gate electrode connected to the connection point between the drain electrode of the P-channel type MOS transistor 28 and the drain electrode of the N-channel type MOS transistor 26, a drain electrode connected to the second node 6, a source electrode connected to the boosted potential node 2, and a back gate connected to the boosted potential node 2. The P-channel type MOS transistor 30 constitutes an inverter circuit with the N-channel type MOS transistor 29, and delivers to the second node 6 a second signal having the Vpp amplitude and a phase opposite to the clock signal of the Vcc amplitude.

When the boosted potential generating circuit of FIG. 13 is incorporated in a semiconductor memory device, such as a DRAM, the N-channel type MOS transistors 24, 26 and 29 and the N-channel type MOS transistor of the inverter circuit 25 can be any MOS transistor structure of either the N-channel type MOS transistor in the twin well structure of FIG. 7 or the N-channel type MOS transistor in the triple well structure of FIG. 11. The P-channel type MOS transistors 27, 28 and 30 and the P-channel type MOS transistor of the inverter circuit 25 can be any MOS transistor structure of either the P-channel type MOS transistor in the twin well structure of FIG. 7 or the P-channel type MOS transistor in the triple well structure of FIG. 11.

The first and second nodes 5 and 6, and the boosted potential node 2 are precharged to the power supply potential Vcc (or a potential equal to the power supply potential minus the threshold voltage of the MOS transistor) by the precharge means (not shown) prior to supplying the boosted potential to the boosted potential node 2. Referring to a waveform diagram shown in FIG. 15, the operation of the boosted potential generating circuit of FIG. 14 is as follows. First, the first and second nodes 5 and 6 and the boosted potential node 2 are precharged to the power supply potential Vcc by the precharge mans before the boosted potential is supplied to the boosted potential node 2 (or before time T0 shown in FIG. 8).

When the clock input node 1 receives the clock signal, as shown in FIG. 15(a), and the power supply potential is applied to the input of the first buffer means 7 at time T0, the output of the first buffer means 7 is also raised from the ground potential to the power supply potential Vcc. The one electrode of the first capacitive element 8 is raised from the ground potential to the power supply potential Vcc, such that the potential of the first node 5 is boosted from Vcc to two times Vcc by capacitive coupling of the first capacitive element 8.

Meanwhile, when the input of the level conversion circuit 23 changes based on the clock signal applied at the clock input node 1 from the ground potential to the power supply potential, its output node changes from the boosted potential Vpp (or at an initial state of potential Vcc of the precharge potential) to the ground potential which is fed to the second node 6.

In the level conversion circuit 23 shown in FIG. 14, the N-channel type MOS transistor 24 and the P-channel type MOS transistor 28 become conductive, and the N-channel type MOS transistor 26, and the P-channel type MOS transistor 27 become non-conductive. As a result, the potential of the connection point between the drain electrode of the P-channel type MOS transistor 28 and the drain electrode of the N-channel type MOS transistor 26 rise to the boosted potential Vpp of the boosted potential node 2. The boosted potential Vpp at this time is Vcc of the precharge potential.

Accordingly, the N-channel transistor 29 becomes conductive and the P-channel transistor 30 becomes non-conductive. The potential of the second node 6 drops to the ground potential. Further, the P-channel type MOS transistor 22 becomes conductive since its source potential becomes 2Vcc, its gate potential becomes the ground potential and its drain potential becomes Vcc. Hence, the charges at the first capacitive element 8 flow into the boosted potential node 2 through the P-channel MOS transistor 22, thereby being stored at the load capacitor 3, so that the potential of the boosted potential node 2 is boosted to Vcc+α. The boosted portion α is determined by the capacitance shared between the capacitances of the first capacitive element 8 and the load capacitor 3.

When the clock signal drops to the ground potential at time T1, the potential of the first buffer means 7 also goes down to the ground potential, so that the potential of the first nodes 5 goes down to Vcc of the precharge potential by capacitive coupling of the first capacitive elements 8. Meanwhile, when the input of the level conversion circuit 23 changes to the ground level, the output node thereof changes to the boosted potential Vpp, which is outputted to the second node 6.

In the level conversion circuit 23 shown in FIG. 14, the N-channel type transistor 24 and the P-channel type transistor 28 become non-conductive, and the N-channel type transistor 26 and the P-channel type transistor 27 become conductive. Hence, the potential of the connection point between the drain electrodes of the P-channel type MOS transistor 28 and the N-channel type MOS transistor 26 drops to the ground potential. Further, the N-channel type transistor 29 becomes non-conductive, and the P-channel type transistor 30 becomes conductive.

The potential of the second node 6 is raised to the boosted potential Vpp of the boosted potential node 2. At this time, the boosted potential Vpp of the boosted potential node 2 is Vcc+α. Hence, the P-channel type MOS transistor 22 becomes non-conductive because its source potential is Vcc, its gate potential is Vpp, and its drain potential is Vcc+α. No charges flow from the boosted potential node 2 to the first node 5.

Next, when the clock signal is raised again to the power supply potential Vcc at time T2, the output of the first buffer means 7 is also raised from the ground potential to the power supply potential Vcc. The potential of the first capacitive element 8 is also raised in the same manner to above, thereby boosting the potential of the first node 5 up to two times Vcc, and the output of the level conversion circuit 23 goes down from the boosted potential Vpp to the ground potential. As a result, the P-channel type MOS transistor 22 becomes conductive, and the charges at the first capacitive element 8 flow into the boosted potential node 2 through the P-channel type MOS transistor 22, thereby further boosting the potential of the boosted potential node 2.

The potential of the boosted potential node 2 is boosted stepwise at every rise of the clock signal from the ground potential to the power supply potential Vcc. Finally, the boosted potential Vpp of 2Vcc is obtained at the boosted potential node 2. Hence, with the boosted potential generating circuit of FIG. 13, the output of the level conversion circuit 23 is a signal having a Vpp amplitude based on the boosted potential Vpp (which finally reaches 2Vcc) fed from the boosted potential node 2 and based on the clock signal of Vcc amplitude. However, large amount of the power is consumed by the boosted potential generating circuit of FIG. 13.

As described above, with the conventional boosted potential generating circuit of FIG. 6, the boosted potential Vpp obtained at the boosted potential Vpp is lowered by the threshold voltage Vth4 of the drive transistor, e.g., N-channel type MOS transistor 4, when the precharge potential is Vcc. If the precharge potential is lowered by a portion of the threshold voltage, the boosted potential Vpp is further lowered such that the boosted potential generating circuit cannot provide an adequate boosted potential.

With the boosted potential generating circuit of FIG. 10, the boosted potential Vpp obtained at the boosted potential node 2 is a potential equal to two times Vcc decreased by a portion the PN junction potential Vjv of the N-channel type MOS transistor 4. The boosted potential generating circuit must be produced with the triple well structure to achieve a boosted potential Vpp, but the number of process steps increases and the production costs become high.

Moreover, with the boosted potential generating circuit of FIG. 13, the boosted potential Vpp obtained at the boosted potential node 2 becomes a level of two times Vcc (power supply potential). However, the boosted potential generating circuit has large power consumption, since the amplitude level at the gate electrode of the P-channel type MOS transistor 22 is from the ground potential to the boosted potential Vpp.

DISCLOSURE OF THE INVENTION

It is an object of this invention to provide a boosted potential generating circuit which outputs a sufficient boosted potential.

It is another object of the invention to provide a boosted potential generating circuit having a twin well structure which outputs a sufficient boosted potential.

It is a further object of the invention to provide a boosted potential generating circuit outputting a sufficient boosted potential and having a low power consumption.

Additional objects, advantages and other features of the invention will be set forth in part in the description which follows and in part will become apparent to those having ordinary skill in the art upon examination of the following or may be learned from the practice of the invention.

According to the present invention, the foregoing and other objects are achieved in part by a boosted potential generating circuit comprising a P-channel type MOS transistor, a first potential repeating means and a second potential repeating means. The P-channel type MOS transistor is connected between a first node and a boosted potential node for outputting a boosted potential, and has a gate electrode connected to a second node. The first potential repeating means supplies a potential of a positive precharge potential and another potential higher than the precharge potential which are repeated at a predetermined period to the first node. The second potential repeating means supplies a potential having a phase opposite to the potential repeated by the first potential repeating means and having a positive precharge potential and another potential higher than the precharge potential which are repeated at a predetermined period to the second node.

In another aspect of the present invention, a boosted potential generating circuit comprises a P-channel type MOS transistor, first and second buffer means, first and second capacitive elements, and a precharge potential generating means. The P-channel type MOS transistor is connected between a first node and a boosted potential node for outputting a boosted potential and has a gate electrode connected to a second node. The first buffer means receives a clock signal and outputs a first signal in phase with the clock signal. The first capacitive element has a first electrode to receive the first signal of the first buffer means and second electrode connected to the first node. The second buffer means receives the clock signal and outputs a second signal in opposite phase to the clock signal. The second capacitive element has a first electrode to receive the second signal of the second buffer means and a second electrode connected to the second node. The precharge potential generating means supplies a precharge potential to the respective first and second nodes.

A further aspect of the invention is a boosted potential generating circuit for providing a boosted potential at a boosted potential node coupled to a semiconductor device. The boosted potential generating circuit comprises a MOS transistor, a plurality of inverters, first and second capacitors, at least one inverter, and at least one precharge potential generator. The MOS transistor is connected between a first node and the boosted potential node, and has a gate electrode connected to a second node. The plurality of inverters receives a clock signal and outputs a first signal in phase with the clock signal. The first capacitor has a first electrode to receive the first signal and a second electrode connected to the first node. At least one inverter receives the clock signal and outputs a second signal in opposite phase to the clock signal. The second capacitor has a first electrode to receive the second signal of at least one inverter, and a second electrode connected to the second node. At least one precharge potential generator supplies a precharge potential to the first and second nodes.

BRIEF DESCRIPTION OF DRAWINGS

The invention will be described in detail with reference to the following drawings in which like reference numerals refer to like elements.

FIGS. 3(*a*)–3(*d*) are waveform diagrams illustrating the potentials of respective portions in the first embodiment of the invention.

FIG. 4 is a circuit diagram illustrating a second embodiment of the invention.

FIG. 5 is a circuit diagram showing a third embodiment of the invention.

FIG. 6 is a circuit diagram of a conventional boosted potential generating circuit.

FIG. 7 is a cross-sectional view schematically showing an N-channel type MOS transistor and a P-channel type MOS transistor fabricated in a twin well structure.

FIGS. 8(*a*)–(*c*) are waveform diagrams showing the potentials of respective portions in the boosted potential generating circuit of FIG. 6.

FIGS. 12(*a*)–(*e*) are waveform diagrams showing potentials of respective portions in the boosted potential generating circuit of FIG. 10.

FIG. 13 is a circuit diagram showing another example of a boosted potential generating circuit.

FIG. 14 is a circuit diagram showing in detail a level conversion circuit of FIG. 13.

FIGS. 15(*a*)–(*d*) are waveform diagrams showing the potentials of respective portions in the boosted potential generating circuit of FIG. 13.

BEST MODE FOR CARRYING OUT THE INVENTION

Figure 1:
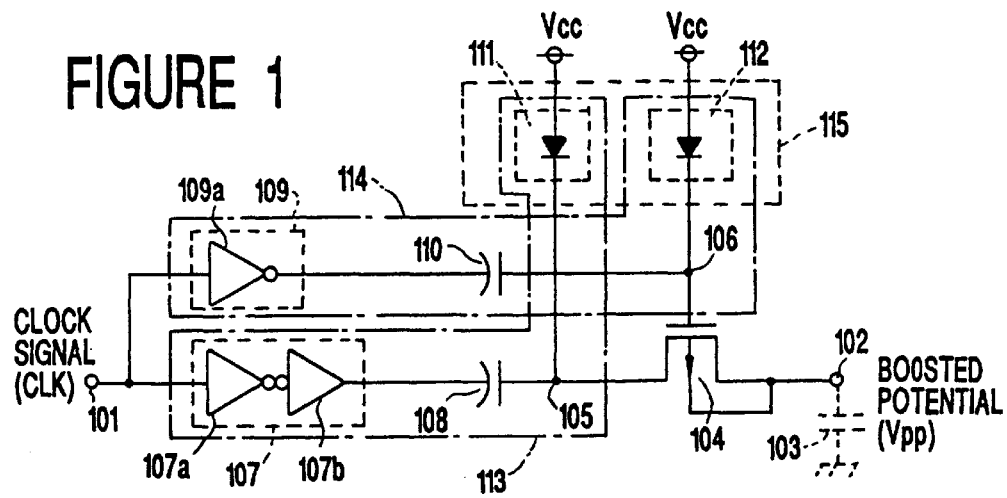
FIG. 1 is a circuit diagram illustrating a first embodiment of the invention.
Figure 2:
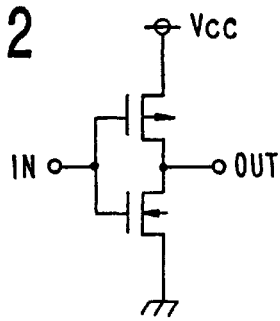
FIG. 2 depicts a circuit diagram in detail of an inverter in the first embodiment of the invention.
Figure 9:
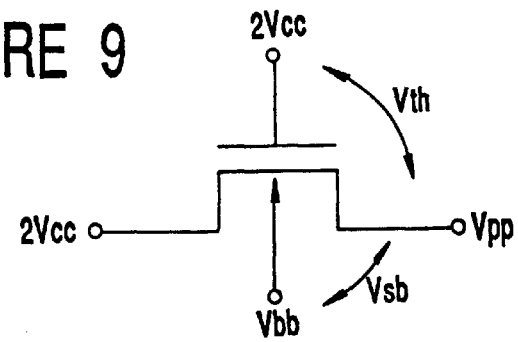
FIG. 9 is a diagram showing a relationship of the potentials at the respective electrodes of the driving transistor, e.g., an N-channel type MOS transistor, in the boosted potential, generating circuit of FIG. 6.
Figure 10:
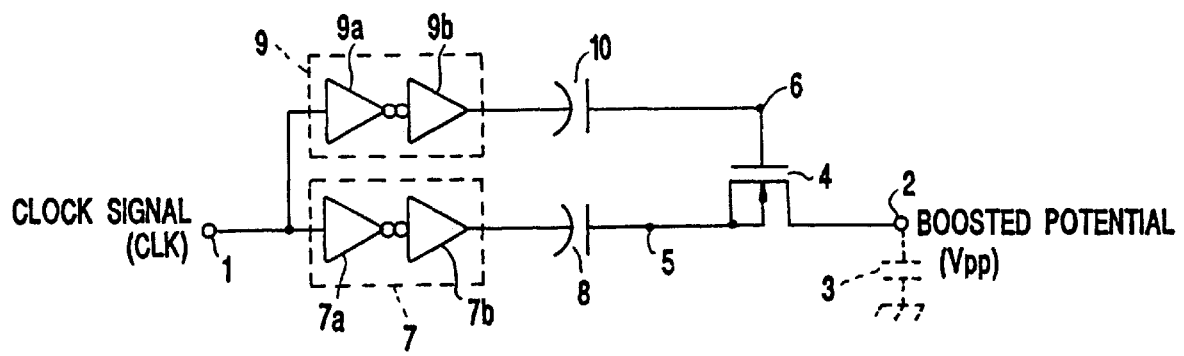
FIG. 10 is a circuit diagram showing another example of a boosted potential generating circuit.

FIGS. 1 to 3 are illustrations of a first embodiment of the invention. In FIG. 1, a boosted potential generating circuit includes a clock input node 101 for receiving a clock (CLK) signal which has a binary level of a ground potential (0 V) and a power supply potential (Vcc), and a boosted potential node 102 for outputting a boosted potential. A load capacitor 103, located between the boosted potential node and the ground potential node, is driven by the boosted potential at the boosted potential node 2 and is generally a parasitic capacitor.

A P-channel type MOS transistor 104 serves as a drive transistor for the boosted potential generating circuit, and is connected between the boosted potential node 102 and a first node 105. The P-channel type MOS transistor 104 can be any transistor structure of either a P-channel type MOS transistor in the twin well structure of FIG. 7 or a P-channel type MOS transistor in the triple well structure of FIG. 11. The gate electrode is connected to a second node 106, and the back gate (n-well region 16) is electrically connected to the drain electrode.

A first buffer means 107 receives the clock signal from the clock input node 101 and outputs a first signal in phase with the clock signal. The first buffer means 107 is composed of an even number of stages, e.g., inverters 107*a* and 107*b* of two stages. As illustrated in FIG. 2, each inverter 107*a* or 107*b* comprises, for example, a P-channel type MOS transistor, connected between the power supply potential node Vcc and an output node OUT with its gate electrode connected to an input node IN, and an N-channel type MOS transistor connected between the output node OUT and the ground potential node with its gate electrode connected to the input node IN.

A first capacitive element 108 has a pair of electrode, one electrode which receives the first signal from the first buffer means 107 and the other electrode connected to the first node 105. A second buffer means 109 receives the clock signal from the clock input node 101 and outputs a second signal having a phase opposite to the clock signal. The second buffer means 109 comprises an odd number of stages, e.g., an inverter 109*a* of a single stage which is illustrated in detail in FIG. 2. A second capacitive element 110 has a pair of electrodes, one electrode which receives the second signal from the second buffer means 109 and the other connected to the second node 106.

A first precharge potential generator 111 precharges the first node 105 to a positive precharge potential, and includes a first diode connected in a forward direction from the power supply potential node Vcc to the first node 105. A second precharge potential generator 112 precharges the second node 106 to a positive precharge potential, and includes a second diode connected in a forward direction from the power supply potential node Vcc to the second node 106.

The first buffer means 107, the first capacitive element 108, and the first precharge potential generator 111 comprise a first potential repeating means 113 for supplying to the first node 105 a potential of a positive precharge potential (e.g., Vcc) and another potential (boosted potential, e.g., 2Vcc) higher than the precharge potential repeating at a predetermined period, as shown in FIG. 3(*b*). The second buffer means 109, the second capacitive element 110, and the second precharge potential generator 112 comprise a second potential repeating means 114 for supplying to the second node 106 a potential having a phase opposite to the repeating potential of the first potential repeating means 113, as shown in FIG. 3(*c*). The second potential repeating means generates a positive precharge potential (e.g., Vcc) and another potential (boosted potential, e.g., 2Vcc) higher than the precharge potential which are repeated at a predetermined period of time.

The first precharge potential generator 111 and the second precharge potential generator 112 constitute precharge potential generating means 115 for feeding a precharge potential to the first and second nodes 105 and 106. The circuit elements shown in FIG. 1 are integrated on a single semiconductor substrate. Referring to a waveform diagram shown in FIG. 3, the operation of the boosted potential generating circuit of FIG. 1 is as follows.

Before the boosted potential is fed to the boosted potential node 102 or before time T0, the first node 105 is precharged to a potential close to the power supply potential Vcc. In other words, the first node is precharge to a potential equal to Vcc–Vjv, where Vjv is the PN junction potential of the diode 111. The second node 106 is precharged to a potential close to the power supply potential Vcc (e.g., Vcc–Vjv) by the second precharge potential generator 112, but is set at a potential equal to 2Vcc–Vjv by the capacitive coupling of the second capacitive element 110. Further, the potential of the boosted potential node 102 is also precharged to a potential close to the power supply potential Vcc by a precharge potential generator, similar to the first and second precharge potential generators 111 and 112.

When the clock signal is applied to the clock input node 101 at time T0, as shown in FIG. 3(*a*), the input of the first buffer means 107 is supplied with the power supply potential, and the output thereof is raised from the ground potential to the power supply potential Vcc. The one electrode of the first capacitive element 108 is raised from the ground potential to the power supply potential Vcc, and therefore, the potential of the first node 105 is raised from Vcc–Vjv (the precharge potential) to 2Vcc–Vjv by the capacitive coupling of the first capacitive element 108.

Meanwhile, the output of the second buffer means 109, which receives the clock signal from the clock input node 101, falls from the power supply potential Vcc to the ground potential. Hence, the potential of the second node 106 also falls to a potential close to the precharge potential Vcc by capacitive coupling of the second capacitive element 110.

The P-channel type MOS transistor 104 then becomes conductive since its source potential is approximately 2Vcc, its gate potential is approximately Vcc, and its drain potential is approximately Vcc. As a result, the charges at the first capacitive element 108 flow into the boosted potential node 102 through the P-channel type MOS transistor 104 and are stored in the load capacitor 103, thereby further boosting the potential of the boosted potential node 2 to Vcc+α. The boosted portion α is determined by the capacitance shared between the capacitances of the first capacitive element 108 and the load capacitor 103.

When the clock signal then falls to the ground potential at time T1, the output potential of the first buffer means 107 also falls to the ground potential, thereby dropping the potential of the first node 105 to approximately the precharge potential Vcc by the capacitive coupling of the first capacitive element 108. On the other hand, the output potential of the second buffer means 109 rises to the power supply potential, and the potential of the second node 106 is raised to 2Vcc−Vjv by the capacitive coupling of the second capacitive element 110.

The P-channel type MOS transistor 104 then becomes non-conductive, because its source potential is approximately Vcc, its gate potential is approximately 2Vcc, and its drain potential is approximately Vcc+α. Charge flow from the boosted potential node 102 to the first node 105 does not occur.

Next, when the clock signal is raised again to the power supply potential Vcc at time T2, the output of the first buffer means 107 is raised from the ground potential to the power supply potential Vcc. Further, the output of the second buffer means 109 is raised from the ground potential to the power supply potential Vcc. Similar to above, the potentials of the first and second capacitive elements 108 and 110 are raised, and the potential of the first node 105 is boosted to approximately two times Vcc. Further, the potential of the second node 106 drops to approximately Vcc.

Consequently, the P-channel type MOS transistor 104 becomes conductive, and the charges at the first capacitive element 108 flow into the boosted potential node 102 through the P-channel type MOS transistor 104, thereby further raising the potential of the boosted potential node 102. The potential of the boosted potential node 102 is thus boosted stepwise at every rise of the clock signal from the ground potential to the power supply potential Vcc, and finally the boosted potential Vpp of approximately 2Vcc (or precisely, 2Vcc−Vjv) is obtained at the boosted potential node 102.

In the boosted potential generating circuit of FIG. 1, a boosted potential Vpp of approximately 2Vcc, i.e., 2Vcc−Vjv, is obtained at the boosted potential node 102. Further, the amplitude level of the potential at the second node 106 is between the precharge potential of approximately Vcc and the boosted potential of approximately 2Vcc. Hence, the increase in the power consumption is suppressed, thereby realizing a low power consuming boosted potential generating circuit.

Figure 11:
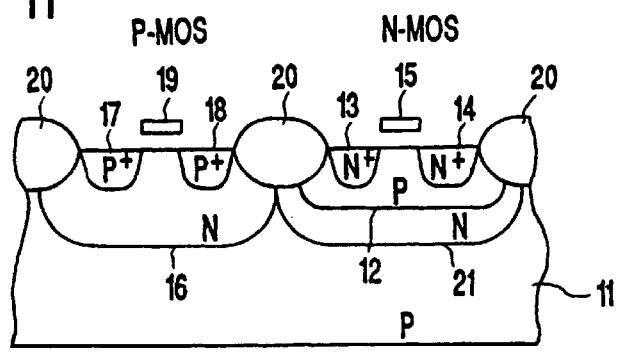
FIG. 11 is a cross-sectional view schematically showing an N-channel type MOS transistor and a P-channel type MOS transistor fabricated in a triple well structure.

The N-channel type MOS transistors and P-channel type MOS transistors of the boosted potential generating circuit can be any transistor structure of either the N-channel type MOS transistors and the P-channel type MOS transistors in the twin well structure of FIG. 7 or the N-channel type MOS transistors and the P-channel type MOS transistors in the triple well structure of FIG. 11. When the boosted potential generating circuit comprises the N-channel type MOS transistors and the P-channel type MOS transistors in the twin well structure of FIG. 7, the steps for processing can be reduced, thereby reducing the production costs.

Since the capacitances annexed to the second node 106, which is shifted from the precharge potential to the boosted potential, is considerably less than the capacitance annexed to the first node 105, which is shifted from the precharge potential to the boosted potential, the drive capability of the second buffer means 109 can be less than the drive capability of the first buffer means 107. Specifically, the drive capability of the inverter 109a at the final stage of the second buffer means 109 can be less than the drive capability of the inverter 107b at the final stage of the first buffer means 107. Hence, the areas occupied by the second buffer means 109 and the second capacitive element 110 on the semiconductor substrate can be reduced, and the power consumption is very low.

FIG. 4 illustrates a second embodiment of the invention. With respect to the first embodiment shown in FIG. 1, N-channel type MOS transistors are used as the first and second precharge potential generators 111 and 112 in lieu of the diodes. The first N-channel type MOS transistor, serving as the first precharge potential generator 111, has its source and gate electrodes connected to the power supply potential node Vcc and its drain electrode connected to the first node 105. The second N-channel type MOS transistor, serving as the second precharge potential generator 112, has its source and gate electrodes connected to the power supply potential node Vcc, and its drain electrode connected to the second node 106.

With the boosted potential generating circuit of the second embodiment, the precharge potential Vcc (power supply potential) supplied Lo the first and second nodes 105 and 106 by the first and second N-channel type MOS transistors is also lowered by a portion of the threshold voltage of the N-channel type MOS transistor. Although the boosted potential Vpp supplied to the boosted potential node 102 is also lowered by a portion of the threshold voltage of the N-channel type MOS transistor, a sufficient boosted potential of approximately 2Vcc is obtained at the boosted potential node 2. With regards to other features, the boosted potential generating circuit of the second embodiment has the same features of the first embodiment.

FIG. 5 illustrates a third embodiment of the invention. With respect to the first embodiment shown in FIG. 1, only the first and second precharge potential generators 111 and 112 are changed, and other elements are the same as the first embodiment. The first precharge potential generator 111 comprises an N-channel type MOS transistor 116, an N-channel type MOS transistor 118 and a capacitor 117.

The N-channel type MOS transistor 116 is connected between the power supply potential node Vcc and the first node 105 with a gate electrode connected to the power supply potential node Vcc. The N-channel type MOS transistor 118 is connected between the power supply potential node Vcc. An electrode of the capacitor receives a signal having a phase opposite to the clock signal inputted at the clock input node 101, e.g., the electrode receives a second signal fed from the second buffer means 109, and another electrode is connected to the gate electrode of the N-channel type MOS transistor 116.

The second precharge potential generator 112 comprises an N-channel type MOS transistor 119, an N-channel type MOS transistor 121, and a capacitor 120. The N-channel type MOS transistor 119 is connected between the power supply potential node Vcc and the second node 106, whose gate electrode is connected to the power supply potential node Vcc. The source of the N-channel type MOS transistor 121 is connected to the power supply potential node Vcc, and the drain electrode is connected to an electrode of the capacitor 120 and the gate of the N-channel type MOS transistor 119. An electrode of the capacitor 120 receives a signal in phase with the clock signal inputted at the clock input node 101, i.e., a first signal fed from the first buffer means 107, and another electrode is connected to the gate electrode of the N-channel type MOS transistor 119.

In the boosted potential generating circuit of FIG. 5, the first and second precharge potential generators 111 and 112 operate as follows. When the output of the second buffer means 109 is at the ground potential during a precharge period, the gate potential at the gate electrode of N-channel type MOS transistor 116 is set at a potential lower than the power supply potential Vcc by a portion of the threshold voltage of the N-channel type MOS transistor 118. Further, the first node 105 is set at a potential equal to the power supply potential Vcc—the threshold voltage of the N-channel type MOS transistor 118—the threshold voltage of the N-channel type MOS transistor 116, via the N-channel type MOS transistor 116.

On the other hand, when the boosted potential node 102 is made to rise and although the first buffer means 107 outputs the power supply potential Vcc and the potential of the first node 105 rises to 2Vcc by the capacitive coupling of the first capacitive element 108, the gate potential of the N-channel type MOS transistor 116 is set at a potential which is equal to the power supply potential Vcc minus the threshold voltage of the fourth N-channel type MOS transistor 118. Since the output of the second buffer means 109 is at the ground potential, the N-channel type MOS transistor 116 is made non-conductive, and the charges do not flow from the first node 105 to the power supply potential node through the N-channel type MOS transistor 116.

Consequently, when the output of the first buffer means 107 is at the ground potential, or when the clock signal inputted at the clock input node 101 is at the ground potential, the potential of the first node 105 is maintained at Vcc. When the output of the first buffer means 107 is at the power supply potential, or when the clock signal given at the clock input node 101 is at the power supply potential, the potential of the first node 105 is maintained at two times Vcc.

The second precharge potential generator 112 operates in a manner similar to the first precharge potential generator 111. When the output of the second buffer means 109 is at the ground potential, or when the clock signal inputted at the clock input node 101 is at the power supply potential, the potential of the second node 106 is maintained at Vcc. When the output of the second buffer means 109 is at the power supply potential, or when the clock signal given at the clock input node 101 is at the ground potential, the potential of the second node 106 is maintained at two times Vcc.

In the boosted potential generating circuit of the third embodiment, a boosted potential Vpp of two times Vcc is obtained at the boosted potential node 102. The potential of the first node 105 equals the power supply potential Vcc and two times Vcc, which are repeated at a predetermined period of time. Further, the potential of the second node 106 has a phase opposite to repeating potentials of the first node 105 and equals the power supply potential Vcc and two times Vcc, which are repeated at a predetermined period. Regarding the other features, the third embodiment has the same features as the first embodiment.

In the explanation of the FIGS. 1, 4 and 5 embodiments of the invention, the clock signal does not have to be continually applied to the clock input node 101 at the predetermined fixed period. When the boosted potential Vpp of the boosted potential node 102 reaches a predetermined potential, the clock signal is not applied to the clock input node 101, and operation of the boosted potential generating circuit is stopped. When the boosted potential Vpp is reduced under the predetermined potential by consumption of an internal circuit which employs the boosted potential Vpp, the clock signal is again applied to the clock input node 101.

Another operation of the boosted potential generating circuit is the row address strobe pumping operation. In such an operation, only one or several number of the clock signals are applied to the clock input node 101, whereby the boosted generating circuit is boosted up if the boosted potential Vpp reaches the predetermined potential, and only when the row address strobe signal relating to a semiconductor memory device falls.

In the explanation of the FIGS. 1, 4 and 5 embodiments of the invention, the first and second capacitive elements 108, 110 are preferably comprised of one of a P-channel MOS capacitor, a N-channel MOS capacitor, a poly-poly capacitor, and a combination of these capacitors. Further, the MOS-transistors are made on the semiconductor substrate, and a Silicon On Insulator (SOI) substrate also may be used for the same transistor circuit to obtain the same result.

It should be understood that, the detailed description and specific embodiment are given by way of illustration only, since various changes and modifications within the spirit and scope of the invention will become apparent to those skilled in the art from the detailed description. Hence, it is understood that the present invention may be practiced otherwise than as specifically described within the scope of the appended claims.

What is claimed is:

1. A boosted potential generating circuit comprising:
    a P-channel MOS transistor connected between a first node and a boosted potential node for outputting a boosted potential, said P-channel MOS transistor having a gate electrode connected to a second node;
    first potential means for supplying a first signal having a first level of a positive precharge potential and a second level of a potential higher than the precharge potential to said first node; and
    second potential means for supplying a second signal having a phase opposite to said first signal supplied by said first potential means and having a third level of the positive precharge potential and a fourth level of a potential higher than the precharge potential to said second node.

2. The boosted potential generating circuit of claim 1, wherein said first potential means includes:
    first buffer means for receiving a clock signal and outputting a signal in phase with the clock signal;
    a first capacitive element with an electrode which receives said signal of said first buffer means and another electrode which is connected to the first node; and
    a first precharge potential generator for precharging the first node to the first level.

3. The boosted potential generating circuit of claim 2, wherein said second potential means includes:
    second buffer means for receiving said clock signal and outputting a signal having a phase opposite to said clock signal;
    a second capacitive element with an electrode to receive the signal of said second buffer means and another electrode connected to the second node; and
    a second precharge potential generator for precharging the second node to the third level.

4. The boosted potential generating circuit of claim 1, wherein said P-channel MOS transistor includes a back gate connected to the boosted potential node.

5. The boosted potential generating circuit of claim 3, wherein said boosted potential generating circuit is integrated on a single semiconductor substrate.

6. The boosted potential generating circuit of claim 2, wherein said first precharge potential generator is one of a diode and a transistor.

7. The boosted potential generating circuit of claim 3, wherein said first precharge potential generator comprises:
- a first N-channel type MOS transistor connected between a power supply node and said first node;
- a second N-channel type MOS transistor connected between said power supply node and a gate electrode said first N-channel type MOS transistor, a gate electrode of said second N-channel type MOS transistor being connected to said power supply node; and
- a third capacitive element having a first electrode to receive the signal having the phase opposite to said clock signal from said second buffer means, and a second electrode connected to the gate electrode of the first N-channel type MOS transistor.

8. The boosted potential generating circuit of claim 3, wherein said second precharge potential generator is one of a diode and a transistor.

9. The boosted potential generating circuit of claim 3, wherein said second precharge potential generator comprises:
- said third N-channel type MOS transistor connected between said power supply node and said second node;
- a fourth N-channel type MOS transistor connected between said power supply node and a gate electrode of said third N-channel type MOS transistor and having a gate electrode connected to said power supply node; and
- a fourth capacitive element having a first electrode to receive the signal in phase with said clock signal from said first buffer means and a second electrode connected to the gate electrode of the third N-channel type MOS transistor.

10. The boosted potential generating circuit of claim 1, wherein said first and second potential means respectively produce repetitive first and second signals, and third and forth signals having a predetermined period.

11. A boosted potential generating circuit comprising:
- a P-channel MOS transistor connected between a first node and a boosted potential node for outputting a boosted potential, said P-channel MOS transistor having a gate electrode connected to a second node;
- first buffer means for receiving a clock signal and outputting a first signal in phase with the clock signal;
- a first capacitive element having a first electrode to receive the first signal of the first buffer means and a second electrode connected to the first node;
- second buffer means for receiving said clock signal and outputting a second signal having a phase opposite to said clock signal;
- a second capacitive element having a first electrode to receive the second signal of the second buffer means and a second electrode connected to the second node; and
- precharge potential generating means for supplying a precharge potential to the respective first and second nodes.

12. The boosted potential generating circuit of claim 11, wherein said P-channel type MOS transistor has a back gate connected to the boosted potential node.

13. The boosted potential generating circuit of claim 11, wherein said precharge potential generating means includes a first diode connected in a forward direction between a power supply node and said first node, and a second diode connected in a forward direction between said power supply node and said second node.

14. The boosted potential generating circuit of claim 11, wherein said precharge potential generating means comprises a first N-channel type MOS transistor having source and gate electrodes connected to a power supply node and a drain electrode connected to said first node, and a second N-channel type MOS transistor having source and gate electrodes connected to said power supply node and a drain electrode connected to said second node.

15. The boosted potential generating circuit of claim 11, wherein said precharge potential generating means includes a first precharge potential generating portion which comprises:
- a first N-channel type MOS transistor connected between a power supply node and said first node;
- a second N-channel type MOS transistor connected between said power supply node and a gate electrode said first N-channel type MOS transistor, a gate electrode of said second N-channel type MOS transistor being connected to said power supply node; and
- a third capacitive element having a first electrode to receive the second signal from said second buffer means, and a second electrode connected to the gate electrode of the first N-channel type MOS transistor.

16. The boosted potential generating circuit of claim 15, wherein said precharge potential generating means further includes a second precharge potential generating portion which comprises:
- a third N-channel type MOS transistor connected between said power supply node and said second node;
- a fourth N-channel type MOS transistor connected between said power supply node and a gate electrode of said third N-channel type MOS transistor and having a gate electrode connected to said power supply node; and
- a fourth capacitive element having a first electrode to receive the first signal from said first buffer means and a second electrode connected to the gate electrode of the third N-channel type MOS transistor.

17. The boosted potential generating circuit of claim 11, wherein said boosted potential node for outputting said boosted potential is connected to a load having a parasitic capacitance.

18. A boosted potential generating circuit for providing a boosted potential at a boosted potential node coupled to a semiconductor device, comprising:
- a P-channel type transistor connected between a first node and the boosted potential node, said P-channel type transistor having a gate electrode connected to a second node;
- a plurality of first inverters to receive a clock signal and to output a first signal in phase with the clock signal;
- a first capacitor having a first electrode to receive the first signal and a second electrode connected to the first node;
- at least one second inverter which receives said clock signal and outputs a second signal having a phase opposite to said clock signal;
- a second capacitor having a first electrode to receive the second signal, and a second electrode connected to the second node; and a plurality of precharge potential generators for supplying a precharge potential to the first and second nodes.

19. The boosted potential generating circuit of claim 18, wherein said P-channel type transistor includes a back gate connected to the boosted potential node.

20. The boosted potential generating circuit of claim 18, wherein the boosted potential generating circuit is integrated on a single semiconductor substrate.

21. The boosted potential generating circuit of claim 18, wherein said plurality of precharge potential generators comprise a first precharge potential generator and a second precharge potential generator.

22. The boosted potential generating circuit of claim 21, wherein said first precharge potential generator comprises one of a diode and a transistor.

23. The boosted potential generating circuit of claim 22, wherein said second precharge potential generator comprises one of a diode and a transistor.

24. The boosted potential generating circuit of claim 21, wherein said first precharge potential generator comprises:
- a first transistor connected between a power supply node and said first node;
- a second transistor connected between said power supply node and a gate electrode of said first transistor, a gate electrode of said second transistor being connected to said power supply node; and
- a third capacitor having a first electrode to receive the second signal from said second inverter, and a second electrode connected to the gate electrode of the first transistor.

25. The boosted potential generating circuit of claim 24, wherein said first and second transistors comprise N-channel type MOS transistors.

26. The boosted potential generating circuit of claim 21, wherein said second precharge potential generator comprises:
- a third transistor connected between said power supply node and said second node;
- a fourth transistor connected between said power supply node and a gate electrode of said third transistor and having a gate electrode connected to said power supply node; and
- a fourth capacitor having a first electrode to receive the first signal from said plurality of first inverters and a second electrode connected to the gate electrode of the third transistor.

27. The boosted potential generating circuit of claim 26, wherein said third and fourth transistors comprise N-channel type MOS transistors.

28. A booster comprising:
- a P-channel transistor connected between a first node and a boosted potential node outputting a boosted potential, said P-channel transistor having a gate connected to a second node;
- a first percharge circuit for supplying the second node with a positive first precharge potential;
- a first capacitor connected between the second node and a third node receiving a first signal, for boosting a potential on the second node in accordance with rise of the first signal;
- a second precharge circuit for supplying the first node with a positive second precharge potential when the first signal is at a high level; and
- a second capacitor connected between the first node and a fourth node receiving a second signal, f or boosting a potential on the first node in accordance with rise of the second signal.

29. The booster according to claim 28, wherein said first precharge circuit supplies the second node with the positive first precharge potential when the second signal is at the high level.

30. The booster according to claim 28, wherein the first signal has a phase opposite to the second signal.

31. The booster according to claim 28, wherein said P-channel transistor has a back gate connected to the boosted potential node.

32. The booster according to claim 28, wherein said first precharge circuit includes:
- a first N-channel transistor connected between the second node and power supply;
- a second N-channel transistor conneced between a gate of said first N-channel transistor and power supply, and having a gate connected to the power supply; and
- a third capacitor connected to the gate of said N-channel transistor.

33. The booster according to claim 28, wherein said second precharge circuit includes:
- a first N-channel transistor connected between the first node and power supply;
- a second N-channel transistor connected between a gate of said first N-channel transistor and power supply, and having a gate connected to the power supply; and
- a third capacitor connected to the gate of said first N-channel transistor.

* * * * *

UNITED STATES PATENT AND TRADEMARK OFFICE
CERTIFICATE OF CORRECTION

PATENT NO. : 6,288,601 B1 Page 1 of 1
DATED : September 11, 2001
INVENTOR(S) : Shigeki Tomishima It is certified that error appears in the above-identified patent and that said Letters Patent is hereby corrected as shown below:

Column 18, claim 28,
Line 6, replace "percharge" to -- precharge --
Line 16, replace "f or" to -- for --

Column 18, claim 32,
Line 35, after "said", insert the word -- first --

Signed and Sealed this

Ninth Day of April, 2002

Attest:

Attesting Officer

JAMES E. ROGAN
Director of the United States Patent and Trademark Office